United States Patent
Choi et al.

(10) Patent No.: US 12,374,412 B2
(45) Date of Patent: Jul. 29, 2025

(54) UNDER DRIVE CONTROL CIRCUIT AND SEMICONDUCTOR APPARATUS INCLUDING THE UNDER DRIVE CONTROL CIRCUIT

(71) Applicant: SK hynix Inc., Icheon-si (KR)

(72) Inventors: Hyung Jin Choi, Icheon-si (KR); Gwi Han Ko, Icheon-si (KR); Chan Hui Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 295 days.

(21) Appl. No.: 17/983,038

(22) Filed: Nov. 8, 2022

(65) Prior Publication Data

US 2023/0410924 A1     Dec. 21, 2023

(30) Foreign Application Priority Data

Jun. 16, 2022 (KR) .......................... 10-2022-0073417

(51) Int. Cl.
| | |
|---|---|
| *G11C 16/04* | (2006.01) |
| *G11C 16/08* | (2006.01) |
| *G11C 16/24* | (2006.01) |
| *G11C 16/26* | (2006.01) |
| *G11C 16/34* | (2006.01) |

(52) U.S. Cl.
CPC .......... *G11C 16/3459* (2013.01); *G11C 16/08* (2013.01); *G11C 16/24* (2013.01); *G11C 16/26* (2013.01)

(58) Field of Classification Search
CPC ..... G11C 16/3459; G11C 16/08; G11C 16/24; G11C 16/26

USPC ..................................................... 365/185.22
See application file for complete search history.

(56) References Cited

U.S. PATENT DOCUMENTS

| | | | | |
|---|---|---|---|---|
| 7,768,811 | B2 * | 8/2010 | Matsuno ............. | G11C 11/2293 365/49.13 |
| 8,040,176 | B2 * | 10/2011 | Ito .......................... | G11C 16/30 327/540 |
| 8,598,942 | B2 * | 12/2013 | Kawashima ........... | G01R 19/32 327/513 |
| 8,644,099 | B2 * | 2/2014 | Cometti ................. | G11C 16/10 365/201 |
| 9,013,432 | B2 * | 4/2015 | Kang ................. | H04M 1/0268 345/173 |
| 9,812,188 | B2 | 11/2017 | Mojumder et al. | |
| 10,636,491 | B2 * | 4/2020 | Shin ....................... | G11C 16/30 |
| 10,777,237 | B2 * | 9/2020 | Joo ......................... | G11C 16/08 |
| 10,930,357 | B2 * | 2/2021 | Terada .................... | G01K 1/14 |

(Continued)

FOREIGN PATENT DOCUMENTS

| | | |
|---|---|---|
| KR | 100476888 B1 | 3/2005 |
| KR | 1020180082830 A | 7/2018 |

*Primary Examiner* — Viet Q Nguyen
(74) *Attorney, Agent, or Firm* — WILLIAM PARK & ASSOCIATES LTD.

(57) ABSTRACT

The present technology may include a voltage generation circuit configured to generate a plurality of voltages in response to at least one voltage control signal, and control logic configured to generate the at least one voltage control signal in order to adjust at least one of an under drive time and an under drive offset during an under drive operation of a semiconductor apparatus according to a temperature information signal and a pre-stored temperature characteristic signal of the semiconductor apparatus.

20 Claims, 5 Drawing Sheets

(56) References Cited

U.S. PATENT DOCUMENTS

| | | | |
|---|---|---|---|
| 11,107,538 B2* | 8/2021 | Her | G06F 12/0866 |
| 11,437,108 B1* | 9/2022 | Muchherla | G11C 16/34 |
| 11,610,639 B2* | 3/2023 | Park | G11C 11/5642 |
| 11,635,915 B2* | 4/2023 | Yeh | G06F 3/0679 |
| | | | 711/103 |
| 2018/0197587 A1* | 7/2018 | Lee | G11C 8/10 |
| 2019/0392907 A1* | 12/2019 | Her | G06F 3/0659 |
| 2020/0194086 A1* | 6/2020 | Kwak | G11C 11/5671 |
| 2022/0068399 A1* | 3/2022 | Cho | G11C 16/24 |

* cited by examiner

UNDER DRIVE CONTROL CIRCUIT AND SEMICONDUCTOR APPARATUS INCLUDING THE UNDER DRIVE CONTROL CIRCUIT

CROSS-REFERENCES TO RELATED APPLICATION

The present application claims priority under 35 U.S.C. § 119(a) to Korean application number 10-2022-0073417, filed on Jun. 16, 2022, in the Korean Intellectual Property Office, which is incorporated herein by reference in its entirety.

BACKGROUND

1. Technical Field

The present disclosure relates to a semiconductor circuit, and particularly, to an under drive control circuit and a semiconductor apparatus including the under drive control circuit.

2. Related Art

Semiconductor apparatuses, for example, memory devices, may be divided into volatile memory devices and nonvolatile memory devices. The nonvolatile memory device may retain stored data even when the supply of power is cut off. Accordingly, in order to store data to be retained regardless of whether power is supplied, nonvolatile memory devices are widely used in portable electronic devices.

The nonvolatile memory devices may be classified into a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like according to a method in which data is stored.

Unlike a volatile memory, since a flash memory does not require a refresh function of rewriting data at regular intervals, the demand for the flash memory is increasing. The flash memory may be electrically programmed and erased. Since the flash memory requires voltages having different target levels for each operation, such as program, read, and verify operations, various levels of voltages may be generated using a voltage generation circuit.

SUMMARY

An under drive control circuit in accordance with an embodiment of the present disclosure may include: a voltage generation circuit configured to generate a plurality of voltages in response to at least one voltage control signal; and control logic configured to generate the at least one voltage control signal in order to adjust at least one of an under drive time and an under drive offset during an under drive operation of a semiconductor apparatus according to a temperature information signal and a pre-stored temperature characteristic signal of the semiconductor apparatus.

An under drive control circuit in accordance with an embodiment of the present disclosure may include: a voltage generation circuit configured to generate a read voltage for a read operation and a verify voltage for a verify operation in response to voltage control signals; and control logic configured to perform at least one of a word line under drive operation during the read operation and a word line under drive operation during the verify operation according to a temperature information signal and a pre-stored temperature characteristic signal of a semiconductor apparatus, and to generate the voltage control signals in order to adjust at least one of an under drive time and an under drive offset in the at least one word line under drive operation.

A semiconductor apparatus in accordance with an embodiment of the present disclosure may include: a memory cell array; an address decoder connected to the memory cell array through a plurality of word lines, and configured to apply a plurality of voltages to a word line corresponding to a decoded row address among the plurality of word lines; and an under drive control circuit configured to generate the plurality of voltages in response to voltage control signals, and generate the voltage control signals in order to adjust at least one of an under drive time and an under drive offset during an under drive operation of a semiconductor apparatus according to a temperature information signal and a pre-stored temperature characteristic signal of the semiconductor apparatus.

DETAILED DESCRIPTION

Hereinafter, embodiments of the present disclosure will be described in more detail with reference to the accompanying drawings.

Various embodiments are directed to providing an under drive control circuit capable of stably generating a voltage in response to a temperature change and a semiconductor apparatus including the under drive control circuit.

Figure 1:
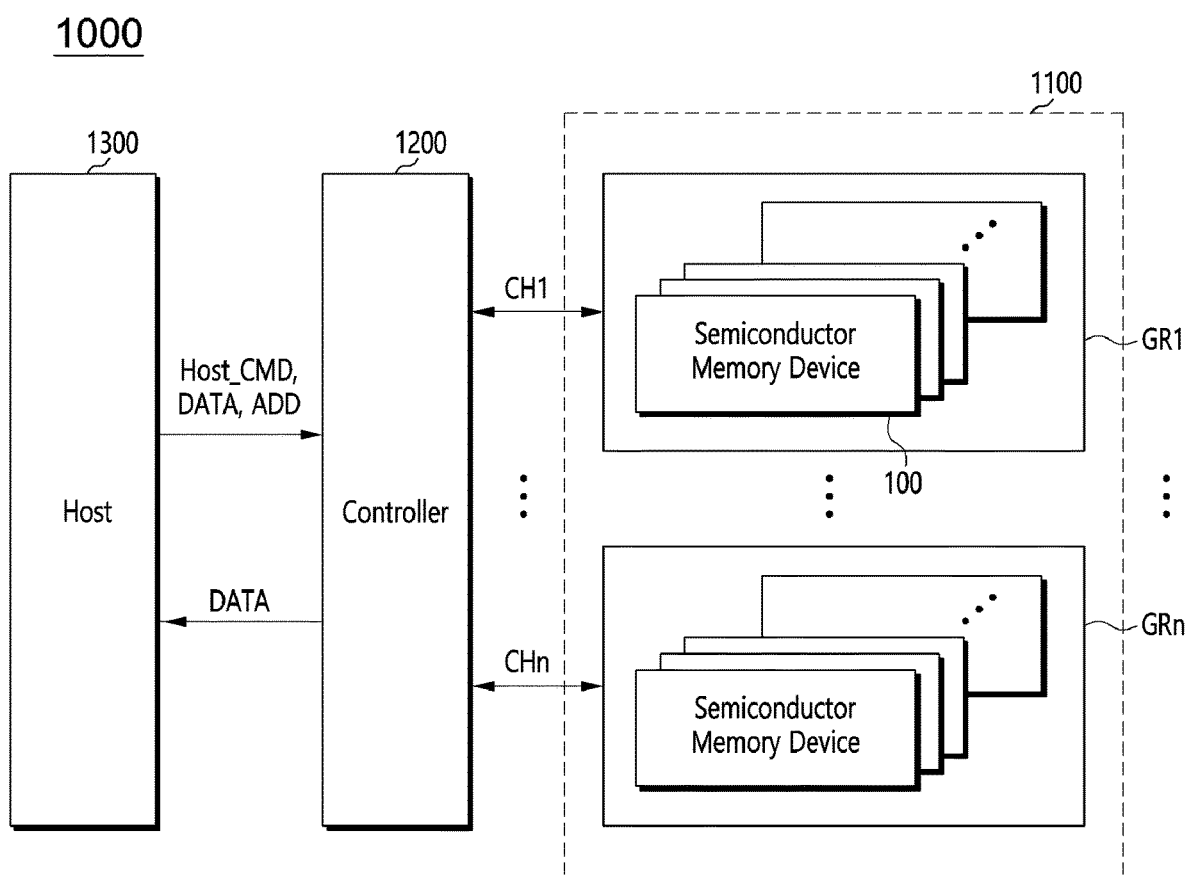
FIG. 1 is a diagram illustrating the configuration of a memory system including a memory device in accordance with an embodiment of the present disclosure.

FIG. 1 is a diagram illustrating the configuration of a memory system 1000 including a memory device in accordance with an embodiment of the present disclosure.

Referring to FIG. 1, the memory system 1000 may include a memory device 1100, a controller Controller 1200, and a host Host 1300. The memory device 1100 includes a plurality of semiconductor apparatuses, for example, a plurality of semiconductor memory devices Semiconductor Memory Devices 100. The plurality of Semiconductor Memory Devices 100 may be divided into a plurality of groups GR1 to GRn. The plurality of groups GR1 to GRn may communicate with the Controller 1200 through first to $n^{th}$ channels CH1 to CHn, respectively. In the embodiment of the present disclosure, the Host 1300 is illustrated and described as being included in the memory system 1000, but the memory system 1000 may include only the Controller 1200 and the memory device 1100 and the Host 1300 may also be disposed outside the memory system 1000.

The Controller 1200 may be configured to control the plurality of semiconductor apparatuses of the memory device 1100, for example, the Semiconductor Memory Devices 100, through the plurality of channels CH1 to CHn. The Controller 1200 is connected between the Host 1300 and the memory device 1100. The Controller is configured to access the memory device 1100 in response to a request from the Host 1300. For example, the Controller 1200 may be configured to control read, program, erase, and verify operations of the memory device 1100 in response to a host command Host_CMD received from the Host 1300. During the program operation, the Host may transmit an address ADD and data DATA to be programmed together with the Host_CMD, and during the read operation, the Host may transmit the address ADD together with the Host_CMD. During the program operation, the Controller 1200 may transmit a command corresponding to the program operation and the data DATA to be programmed to the memory device 1100. During the read operation, the Controller 1200 may transmit a command corresponding to the read operation to the memory device 1100, receive read data DATA from the memory device 1100, and transmit the received data DATA to the Host 1300. The Controller 1200 may be configured to provide an interface between the memory device 1100 and the Host 1300.

As an embodiment, the memory device 1100 or the memory system 1000 may be mounted in various types of packages. The memory device 1100 or the memory system 1000 may be packaged and mounted in a manner such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 2:
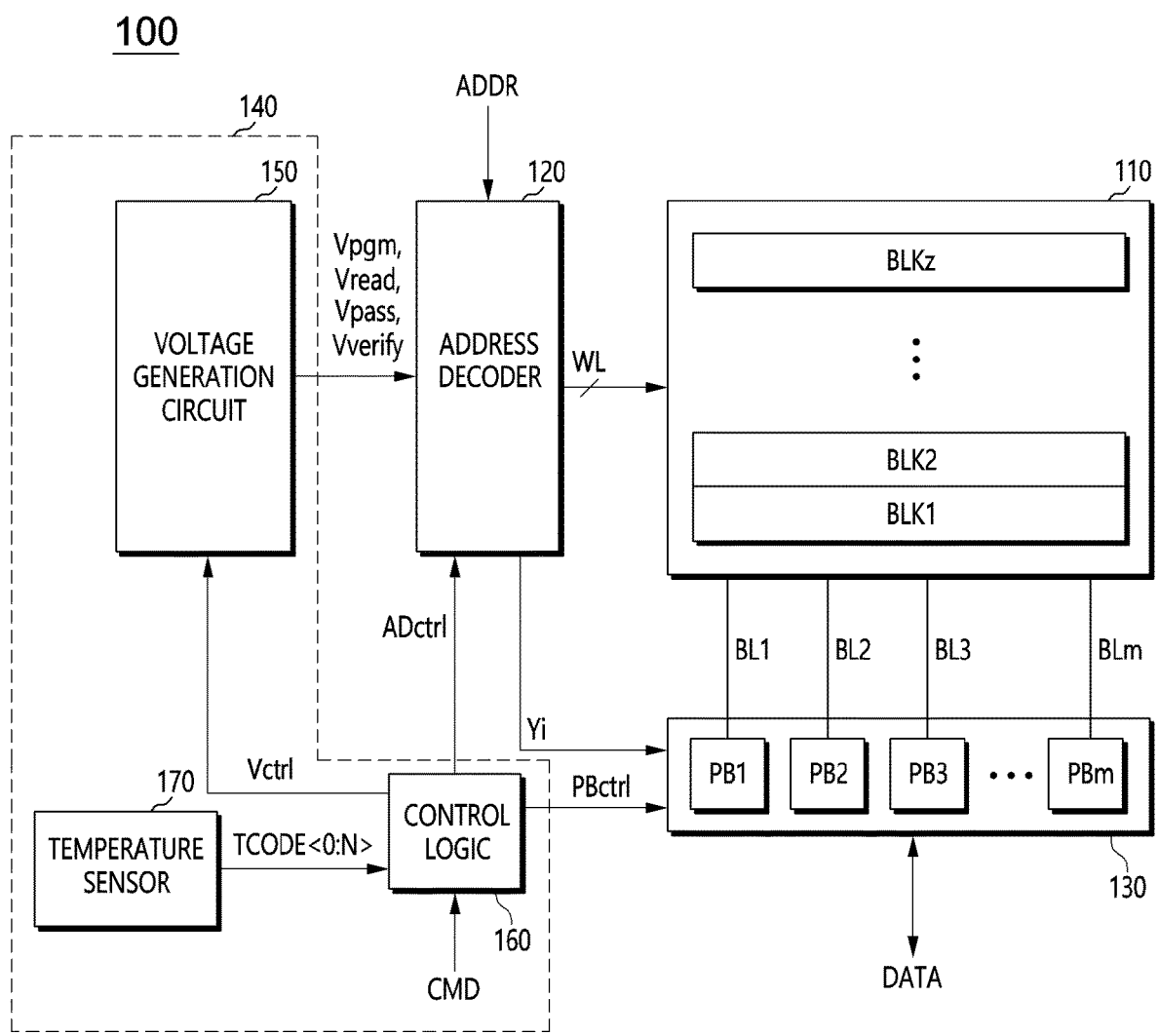
FIG. 2 is a diagram illustrating the configuration of a semiconductor apparatus in FIG. 1.

FIG. 2 is a diagram illustrating the configuration of the Semiconductor Memory Device 100 in FIG. 1.

Referring to FIG. 2, the Semiconductor Memory Device 100 may include a memory cell array 110, an address decoder 120, a read/write circuit 130, and an under-drive control circuit 140. The under drive control circuit 140 may include a voltage generation circuit 150, control logic 160, and a temperature sensor 170. The control logic 160 may be implemented as hardware, software, or a combination of hardware and software. For example, the control logic 160 may be a control logic circuit operating in accordance with an algorithm and/or a processor executing control logic code.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read/write circuit 130 through bit lines BL1 to BLm. Each of the plurality of memory blocks BLK1 to BLKz may include a plurality of memory cells. Each of the plurality of memory cells may be configured in the form of a multilevel cell capable of storing information of one bit or more per one cell. In an embodiment, the plurality of memory cells are nonvolatile memory cells. A plurality of memory cells connected to one word line among the plurality of memory cells may be defined as one page. That is, the memory cell array 110 may include a plurality of pages. Each of the plurality of memory blocks BLK1 to BLKz of the memory cell array 110 may include a plurality of memory strings, which will be described in detail with reference to FIG. 4 and FIG. 5 to be described below.

The address decoder 120 may be connected to the memory cell array 110 through the word lines WL. The address decoder 120 may be configured to operate according to address decoder control signals ADctrl generated by the control logic 160. The address decoder 120 may receive addresses ADDR through an input/output buffer (not illustrated) inside the Semiconductor Memory Device 100, and decode each row address and each column address among the received addresses ADDR. The address decoder 120 may apply a plurality of operating voltages including a program voltage Vpgm, a read voltage Vread, a pass voltage Vpass, and a verify voltage Vverify generated by the voltage generation circuit 150 to a word line WL corresponding to the decoded row address. The address decoder 120 may transmit a decoded column address Yi to the read/write circuit 130. The address decoder 120 may select one memory block and one word line according to a block address and a row address.

The read/write circuit 130 may include a plurality of page buffers PB1 to PBm. The plurality of page buffers PB1 to PBm may be connected to the memory cell array 110 through the bit lines BL1 to BLm. The plurality of page buffers PB1 to PBm may perform a sensing operation for sensing program states of memory cells connected to the bit lines BL1 to BLm during the read operation or the verify operation. During the sensing operation, each of the plurality of page buffers PB1 to PBm may precharge a sensing node in the page buffer to a predetermined level, control the potential level of the sensing node on the basis of the amount of current of the corresponding bit lines BL1 to BLm, and then latch data corresponding to the potential level of the sensing node. The plurality of page buffers PB1 to PBm may also receive and store data to be programmed during the program operation, and adjust the potential levels of the corresponding bit lines BL1 to BLm on the basis of the stored data. The read/write circuit 130 may operate in response to page buffer control signals PBctrl output from the control logic 160. In an embodiment, the read/write circuit 130 may include page buffers (or page registers), a column selection circuit, and the like. The word "predetermined" as used herein with respect to a parameter, such as a predetermined level, predetermined time, and predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The under drive control circuit 140 may be configured to generate a plurality of voltages in response to voltage control signals, and to generate the voltage control signals in order to adjust at least one of an under drive time and an under drive offset during an under drive operation of the semiconductor apparatus according to a temperature information signal and a pre-stored temperature characteristic signal of the semiconductor apparatus. The under drive control circuit 140 may include the voltage generation circuit 150, the control logic 160, and the temperature sensor 170.

The voltage generation circuit 150 may generate a plurality of voltages necessary for the operation of the Semiconductor Memory Device 100. During the program operation, the voltage generation circuit 150 may generate the program voltage Vpgm, the pass voltage Vpass, and the verify voltage Vverify according to voltage control signals Vctrl output from the control logic 160, and output the generated voltages to the address decoder 120. During the read operation, the voltage generation circuit 150 may generate the read voltage Vread and the pass voltage Vpass according to the voltage control signals Vctrl output from the control logic 160, and output the generated voltages to the address decoder 120.

The control logic 160 may be connected to the address decoder 120, the read/write circuit 130, and the voltage generation circuit 150. The control logic 160 may receive a command CMD through the input/output buffer (not illustrated) of the Semiconductor Memory Device 100. The control logic 160 may be configured to control overall operations of the Semiconductor Memory Device 100 in response to the command CMD. The control logic 160 may receive the command CMD and temperature information signals TCODE<0:N>, generate the address decoder control signals ADctrl for controlling the address decoder 120, the page buffer control signals PBctrl for controlling the read/write circuit 130, and the voltage control signals Vctrl for the controlling voltage generation circuit 150, in response to the received command CMD and temperature information signals TCODE<0:N>, and output the generated control signals.

In response to the temperature information signals TCODE<0:N>, the control logic 160 may adjust at least one of the under drive time and the under drive offset during a word line under drive operation (hereinafter, referred to as the under drive operation) of the Semiconductor Memory Device 100. The under drive operation, the under drive time, and the under drive offset will be described below with reference to FIG. 4 to FIG. 7.

The control logic 160 may determine the current temperature of the Semiconductor Memory Device 100 according to the temperature information signals TCODE<0:N>, and adjust values of the voltage control signals Vctrl in order to correct at least one of the under drive time and the under drive offset during the under drive operation so as to match the current temperature and temperature operating characteristics of the Semiconductor Memory Device 100.

The temperature sensor 170 may detect the temperature of the Semiconductor Memory Device 100 and generate the temperature information signals TCODE<0:N>. The temperature information signals TCODE<0:N> may have different code values according to the temperature of the Semiconductor Memory Device 100. For example, when the temperature of the Semiconductor Memory Device 100 is −25° C., the temperature information signals TCODE<0:N> may have a value of '000', and when the temperature of the Semiconductor Memory Device 100 is 100° C., the temperature information signals TCODE<0:N> may have a value of '111'.

Figure 3:
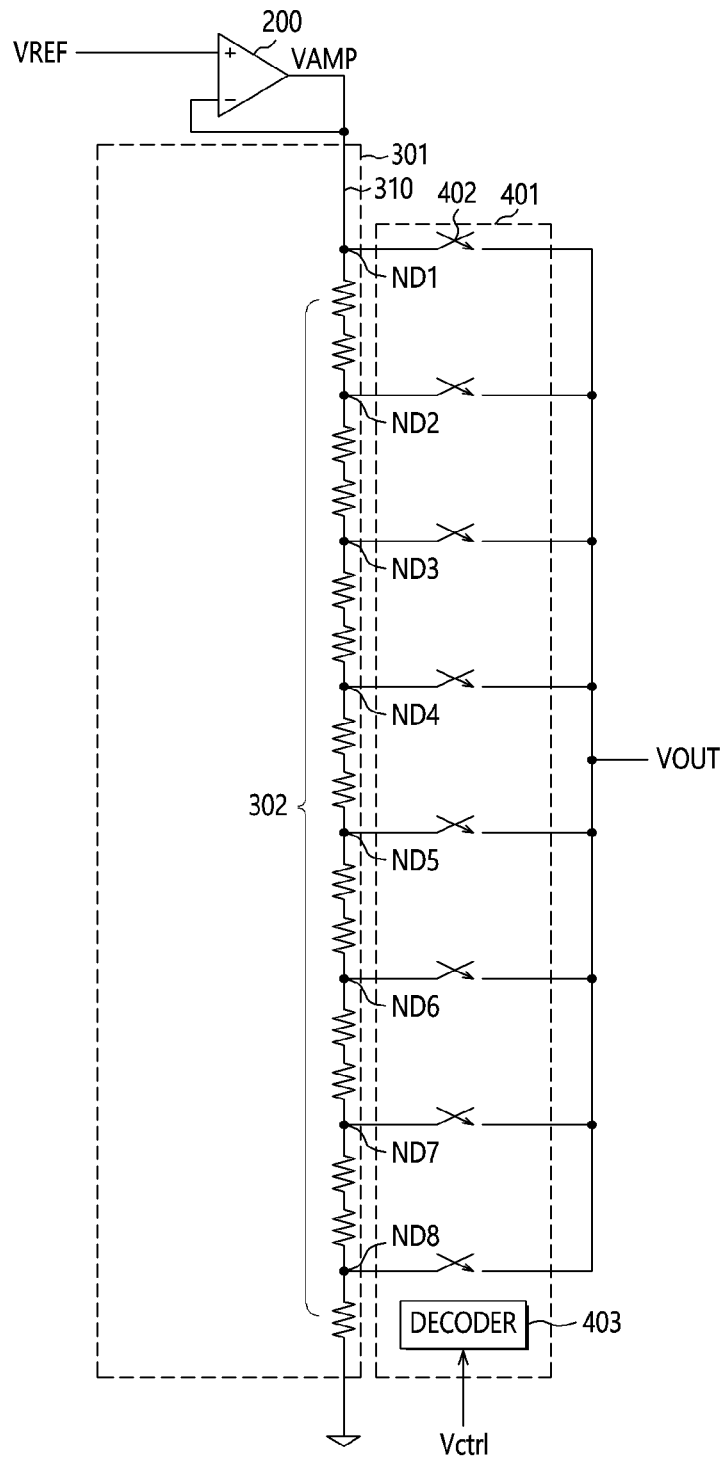
FIG. 3 is a diagram illustrating the configuration of a voltage generation circuit in FIG. 2.

FIG. 3 is a diagram illustrating the configuration of the voltage generation circuit 150 in FIG. 2.

Figure 6:
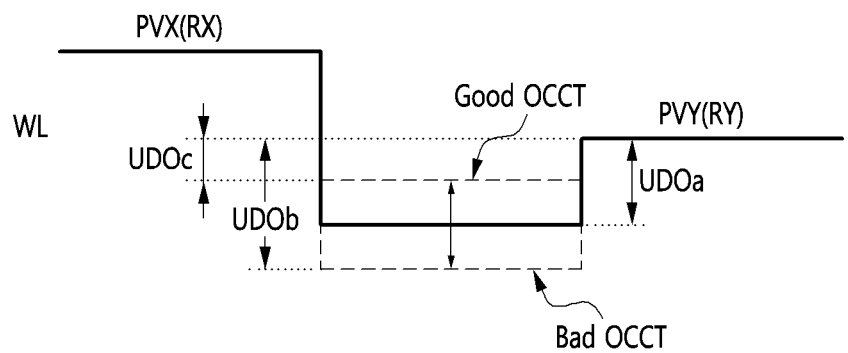
FIG. 6 is a diagram illustrating another example of a method for controlling an under drive operation of the semiconductor apparatus in accordance with an embodiment of the present disclosure.

The voltage generation circuit 150 in accordance with an embodiment of the present disclosure may generate the program voltage Vpgm, the read voltage Vread, the pass voltage Vpass, and the verify voltage Vverify by using at least one voltage generation unit. The voltage generation circuit 150 may generate the program voltage Vpgm, the read voltage Vread, the pass voltage Vpass, and the verify voltage Vverify by sharing one voltage generation unit or using a plurality of voltage generation units. FIG. 6 illustrates a configuration example of a voltage generation unit 151 included in the voltage generation circuit 150.

Referring to FIG. 3, the voltage generation unit 151 may include a differential amplifier 200, a resistor array 301, and a multiplexer 401.

The differential amplifier 200 may receive a reference voltage VREF and its own output, that is, an amplified voltage VAMP, and substantially maintain the amplified voltage VAMP at substantially the same level as the reference voltage VREF.

The resistor array 301 may include a plurality of resistors 302 connected between a power terminal, that is, an output terminal of the amplified voltage VAMP of the differential amplifier 200 and a ground terminal.

Some of nodes of the resistor array 301 will be referred to as output nodes, and voltages obtained by dividing the amplified voltage VAMP at different distribution ratios may be output through output nodes ND1 to ND8.

For example, when resistance values of the plurality of resistors 302 are substantially identical to one another, voltage levels output through the output nodes ND1 to ND8 may have values corresponding to 8/8*VREF, 7/8*VREF, 6/8*VREF, 5/8*VREF, 4/8*VREF, 3/8*VREF, 2/8*VREF, and 1/8*VREF in order from a first output node ND1 closest to the output terminal of the amplified voltage VAMP to an eighth output node ND8 closest to the ground terminal.

The multiplexer 401 may select one of the voltage levels output through the output nodes ND1 to ND8 of the resistor array 301, according to the voltage control signals Vctrl, and output the selected voltage level of the node as an output voltage VOUT. The output voltage VOUT may be used as at least one of the program voltage Vpgm, the read voltage Vread, the pass voltage Vpass, and the verify voltage Vverify.

The multiplexer 401 may include a plurality of voltage selection switches 402 and a decoder 403.

One ends of the plurality of voltage selection switches 402 may be connected to the output nodes ND1 to ND8, respectively, and the other ends thereof may be connected in common to a terminal of the output voltage VOUT.

The decoder 403 may decode the voltage control signals Vctrl, and connect one of the plurality of voltage selection switches 402 to the terminal of the output voltage VOUT according to the decoding result.

Figure 4:
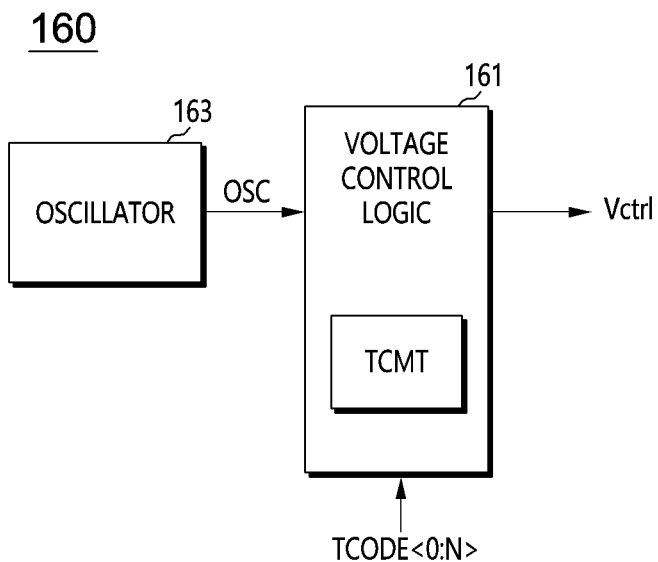
FIG. 4 is a diagram illustrating the configuration of a control logic in FIG. 2.

FIG. 4 is a diagram illustrating the configuration of the control logic 160 in FIG. 2.

The control logic 160 may include a plurality of logic circuits for controlling overall operations of the Semiconductor Memory Device 100. FIG. 4 illustrates a configuration example related to voltage control. Referring to FIG. 4, the control logic 160 may include voltage control logic 161 and an oscillator 163. The voltage control logic 161 may be implemented as hardware, software, or a combination of hardware and software. For example, the voltage control logic 161 may be a voltage control logic circuit operating in accordance with an algorithm and/or a processor executing voltage control logic code.

The oscillator 163 may generate a periodic signal OSC having a predetermined period.

The voltage control logic 161 may include a temperature characteristics mapping table (TCMT). The TCMT may include the temperature characteristic signal of the Semiconductor Memory Device 100, under drive time (UDT) values, and under drive offset (UDO) values.

The temperature characteristic signal may be set by dividing the temperature condition of the Semiconductor Memory Device 100 for each section, for example, into hot and cold temperature sections Hot Temperature and Cold Temperature, and determining the operational characteristics of the Semiconductor Memory Device 100 as good or bad in a corresponding section through a pre-test. For example, the temperature characteristic signal may be information in which operational characteristics at cold temperature (OCCT) of the Semiconductor Memory Device 100 is determined as Good/Bad. For example, when an operation performance-related indicator determined by the OCCT self, for example, the operation performance of the voltage generation circuit 150 is above a desired level, it may be determined as "Good OCCT", and otherwise, it may be determined as "Bad OCCT". Then, a corresponding value may be stored in the TCMT as the temperature characteristic signal.

The under drive time (UDT) values may include a basic value UDTa, a first adjustment value UDTb according to Bad OCCT, and a second adjustment value UDTc according to Good OCCT. The under drive offset (UDO) values may include a basic value UDOa, a first adjustment value UDOb according to Bad OCCT, and a second adjustment value UDOc according to Good OCCT.

The under drive operation is an operation applied to stabilize the voltage level of the word line WL to a target level, and may be applied to, for example, the read operation and the verify operation of the Semiconductor Memory Device 100. An under drive operation in the verify operation may be performed by applying the verify voltage Vverify to a word line at a level (hereinafter, referred to as the under drive level), which is lower than a target level, for a predetermined time in a section between verify pulses generated according to the verify voltage Vverify, and an under drive operation in the read operation may be performed by applying the read voltage Vread to a word line at the under drive level for a predetermined time in a section between read pulses generated according to the read voltage Vread. The under drive time is a time when the verify voltage Vverify/read voltage Vread is applied at a level lower than the target level, and the under drive offset is a difference between the target level of the verify voltage Vverify/read voltage Vread and the under drive level.

The voltage control logic 161 may determine a temperature section of the Semiconductor Memory Device 100 according to the temperature information signals TCODE<0:N>.

The voltage control logic 161 may select one value that matches the currently determined temperature section and the temperature characteristic signal of the Semiconductor Memory Device 100 among the under drive time values UDTa, UDTb, and UDTc stored in the TCMT, and generate the voltage control signals Vctrl based on the selected value.

The voltage control logic 161 may select one value that matches the currently determined temperature section and the temperature characteristic signal of the Semiconductor Memory Device 100 among the under drive offset values UDOa, UDOb, and UDOc stored in the TCMT, and generate the voltage control signals Vctrl based on the selected value.

The voltage control logic 161 may select one of the under drive time values UDTa, UDTb, and UDTc stored in the TCMT and one of the under drive offset values UDOa, UDOb, and UDOc stored in the TCMT, the selected values matching the currently determined temperature section and the temperature characteristic signal of the Semiconductor Memory Device 100, and generate the voltage control signals Vctrl based on the selected values.

The voltage control logic 161 may adjust the under drive offset UDO by adjusting the values of the voltage control signals Vctrl. When the values of the voltage control signals Vctrl are adjusted, the voltage generation circuit 150 may adjust the levels of the read voltage Vread and the verify voltage Vverify in response to the adjustment.

The voltage control logic 161 may adjust the under drive time UDT by adjusting the generation timing of the voltage control signals Vctrl according to the periodic signal OSC. When the generation timing of the voltage control signals Vctrl is adjusted, the voltage generation circuit 150 may adjust the level adjustment timings of the read voltage Vread and the verify voltage Vverify in response to the adjustment.

Hereinafter, a method for controlling the under drive operation of the Semiconductor Memory Device in accordance with an embodiment of the present disclosure will be described with reference to FIG. 5 to FIG. 7.

When the Semiconductor Memory Device 100 has a multilevel cell structure, the verify operation and the read operation may be performed through a plurality of verify pulses and a plurality of read pulses, respectively. A plurality of verify pulses PVX and PVY may be generated according to the verify voltage Vverify, and a plurality of read pulses RX and RY may be generated according to the read voltage Vread.

Figure 5:
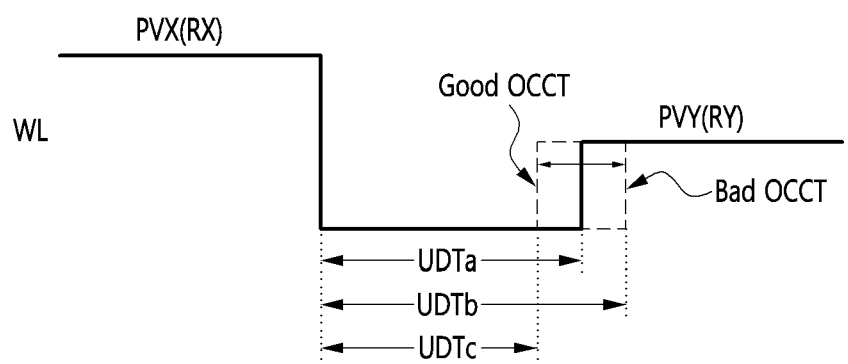
FIG. 5 is a diagram illustrating an example of a method for controlling an under drive operation of the semiconductor apparatus in accordance with an embodiment of the present disclosure.

FIG. 5 is a diagram illustrating an example of a method for controlling the under drive operation of the Semiconductor Memory Device in accordance with an embodiment of the present disclosure.

As illustrated in FIG. 5, the method for controlling the under drive operation of the Semiconductor Memory Device in accordance with the present disclosure may be performed by varying the under drive time UDT according to the temperature characteristic signal.

For example, when a temperature section determined according to the temperature information signals TCODE<0:N> is a cold temperature section and the operational characteristics OCCT of the Semiconductor Memory Device 100 is "Bad OCCT", the under drive time UDT is changed to the first adjustment value UDTb increased from the basic value UDTa. As the Semiconductor Memory Device 100 having the operational characteristics OCCT of "Bad OCCT" operates in the cold temperature section, the performance of the voltage generation circuit 150 may be degraded. However, as the under drive time UDT is increased, the voltage level of the word line WL may be more rapidly stabilized to the target level.

When the operational characteristics OCCT of the Semiconductor Memory Device 100 is "Good OCCT", the under drive time UDT is changed to the second adjustment value UDTc decreased from the basic value UDTa. As the Semiconductor Memory Device 100 having the operational characteristics OCCT of "Good OCCT" operates in the cold temperature section, the performance of the voltage generation circuit 150 may be above a desired level. Accordingly, the voltage level of the word line WL may be more rapidly stabilized to the target level by decreasing the under drive time UDT.

FIG. 6 is a diagram illustrating another example of a method for controlling the under drive operation of the Semiconductor Memory Device in accordance with an embodiment of the present disclosure.

As illustrated in FIG. 6, the method for controlling the under drive operation of the Semiconductor Memory Device in accordance with the present disclosure may be performed by varying the under drive offset UDO according to the temperature characteristic signal.

For example, when a temperature section determined according to the temperature information signals TCODE<0:N> is a cold temperature section, and the operational characteristics OCCT of the Semiconductor Memory Device 100 is "Bad OCCT", the under drive offset UDO is changed to the first adjustment value UDOb increased from the basic value UDOa. As the Semiconductor Memory Device 100 having the operational characteristics OCCT of "Bad OCCT" operates in the cold temperature section, the performance of the voltage generation circuit 150 may be degraded. However, as the under drive offset UDO is increased, the voltage level of the word line WL may be more rapidly stabilized to the target level.

When the operational characteristics OCCT of the Semiconductor Memory Device 100 is "Good OCCT", the under drive offset UDO is changed to the second adjustment value UDOc decreased from the basic value UDOa. As the Semiconductor Memory Device 100 having the operational characteristics OCCT of "Good OCCT" operates in the cold temperature section, the performance of the voltage generation circuit 150 may be above a desired level. Accordingly, the voltage level of the word line WL may be more rapidly stabilized to the target level by decreasing the under drive offset UDO.

Figure 7:
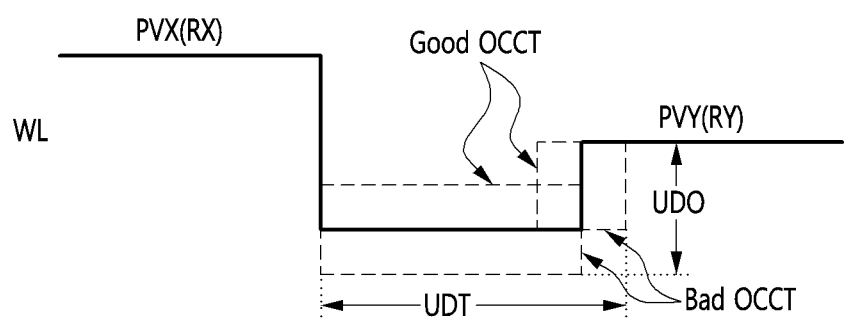
FIG. 7 is a diagram illustrating further another example of a method for controlling an under drive operation of the semiconductor apparatus in accordance with an embodiment of the present disclosure.

FIG. 7 is a diagram illustrating further another example of a method for controlling the under drive operation of the Semiconductor Memory Device in accordance with an embodiment of the present disclosure.

As illustrated in FIG. 7, the method for controlling the under drive operation of the Semiconductor Memory Device in accordance with the present disclosure may be performed by varying the under drive time UDT and the under drive offset UDO according to the temperature characteristic signal.

For example, when a temperature section determined according to the temperature information signals TCODE<0:N> is a cold temperature section, and the operational characteristics OCCT of the Semiconductor Memory Device 100 is "Bad OCCT", the under drive time UDT is changed to the first adjustment value UDTb increased from the basic value UDTa and the under drive offset UDO is changed to the first adjustment value UDOb increased from the basic value UDOa. As the Semiconductor Memory Device 100 having the operational characteristics OCCT of "Bad OCCT" operates in the cold temperature section, the performance of the voltage generation circuit 150 may be degraded. However, as the under drive time UDT and the under drive offset UDO are increased, the voltage level of the word line WL may be more rapidly stabilized to the target level.

When the operational characteristics OCCT of the Semiconductor Memory Device 100 is "Good OCCT", the under drive time UDT is changed to the second adjustment value UDTc decreased from the basic value UDTa and the under drive offset UDO is changed to the second adjustment value UDOc decreased from the basic value UDOa. As the Semiconductor Memory Device 100 having the operational characteristics OCCT of "Good OCCT" operates in the cold temperature section, the performance of the voltage generation circuit 150 may be above a desired level. Accordingly, the voltage level of the word line WL may be more rapidly stabilized to the target level by decreasing the under drive time UDT and the under drive offset UDO.

In the present disclosure, the method for controlling the under drive operation described with reference to FIG. 5 to FIG. 7 may be selectively used according to the temperature information signals TCODE<0:N>.

When a cold temperature section is divided into a first cold temperature section and a second cold temperature section lower than the first cold temperature section, the operational characteristics OCCT may be more degraded in the second cold temperature section than the first cold temperature section. For example, in the case of "Bad OCCT", the operation performance of the Semiconductor Memory Device 100 may be more degraded in the second cold temperature section than in the first cold temperature section.

Accordingly, in the present disclosure, the cold temperature section may be divided into a plurality of sections, for example, the first cold temperature section and the second cold temperature section lower than the first cold temperature section. When a temperature section determined according to the temperature information signals TCODE<0:N> is the first cold temperature section, one of the control method according to FIG. 5 and the control method according to FIG. 6 may be selectively used, and when the temperature section determined according to the temperature information signals TCODE<0:N> is the second cold temperature section, the control method according to FIG. 7 may be used.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all modifications or modified forms derived from the equivalent concept thereof are included in the scope of the present disclosure.

What is claimed is:

1. An under drive control circuit comprising:
   a voltage generation circuit configured to generate a plurality of voltages in response to at least one voltage control signal; and
   control logic configured to generate the at least one voltage control signal in order to adjust at least one of an under drive time and an under drive offset during an under drive operation of a semiconductor apparatus according to a temperature information signal and a pre-stored temperature characteristic signal of the semiconductor apparatus,
   wherein the under drive operation is performed by applying a first voltage of the plurality of voltages to a word line at an under drive level, which is lower than a target level, for a predetermined time in a section between pulses generated according to the first voltage in an operation process of at least one of operations of the semiconductor apparatus.

2. The under drive control circuit according to claim 1, wherein the temperature characteristic signal is generated and stored by dividing a temperature condition of the semiconductor apparatus into hot and cold temperature sections, and determining operational characteristics of the semiconductor apparatus as good or bad in the hot and cold temperature sections.

3. The under drive control circuit according to claim 1, wherein the under drive time is a time when the first voltage is applied at the under drive level, and the under drive offset is a difference between a target level of the first voltage and the under drive level.

4. The under drive control circuit according to claim 1, further comprising:
a temperature sensor configured to detect a temperature of the semiconductor apparatus and generate the temperature information signal.

5. The under drive control circuit according to claim 1, wherein the control logic is configured to adjust the under drive offset by adjusting a value of the at least one voltage control signal, and to adjust the under drive time by adjusting a generation timing of the at least one voltage control signal.

6. The under drive control circuit according to claim 1, wherein the control logic is configured to divide a cold temperature section of a temperature section of the semiconductor apparatus into a first cold temperature section and a second cold temperature section lower than the first cold temperature section,
to adjust one of the under drive time and the under drive offset when a temperature section determined according to the temperature information signal is the first cold temperature section, and
to adjust the under drive time and the under drive offset when the temperature section determined according to the temperature information signal is the second cold temperature section.

7. The under drive control circuit according to claim 1, wherein the control logic comprises:
an oscillator configured to generate a periodic signal; and
voltage control logic configured to select at least one value that matches the temperature information signal and the temperature characteristic signal among under drive time values and under drive offset values stored in a temperature characteristics mapping table, and to generate the at least one voltage control signal according to a selected signal and the periodic signal.

8. An under drive control circuit comprising:
a voltage generation circuit configured to generate a read voltage for a read operation and a verify voltage for a verify operation in response to voltage control signals; and
control logic configured to perform at least one of a word line under drive operation during the read operation and a word line under drive operation during the verify operation according to a temperature information signal and a pre-stored temperature characteristic signal of a semiconductor apparatus, and to generate the voltage control signals in order to adjust at least one of an under drive time and an under drive offset in the at least one word line under drive operation,
wherein the at least one word line under drive operation is performed by applying a corresponding voltage of the read voltage and the verify voltage to a word line at an under drive level, which is lower than a target level, for a predetermined time in a section between pulses generated according to the corresponding voltage.

9. The under drive control circuit according to claim 8, wherein the temperature characteristic signal is generated and stored by dividing a temperature condition of the semiconductor apparatus into hot and cold temperature sections, and determining operational characteristics of the semiconductor apparatus as good or bad in the hot and cold temperature sections.

10. The under drive control circuit according to claim 8, wherein the under drive time is a time when the corresponding voltage is applied at the under drive level, and the under drive offset is a difference between a target level of the corresponding voltage and the under drive level.

11. The under drive control circuit according to claim 8, further comprising:
a temperature sensor configured to detect a temperature of the semiconductor apparatus and generate the temperature information signal.

12. The under drive control circuit according to claim 8, wherein the control logic is configured to adjust the under drive offset by adjusting values of the voltage control signals, and to adjust the under drive time by adjusting generation timings of the voltage control signals.

13. The under drive control circuit according to claim 8, wherein the control logic is configured to divide a cold temperature section of a temperature section of the semiconductor apparatus into a first cold temperature section and a second cold temperature section lower than the first cold temperature section,
to adjust one of the under drive time and the under drive offset when a temperature section determined according to the temperature information signal is the first cold temperature section, and
to adjust the under drive time and the under drive offset when the temperature section determined according to the temperature information signal is the second cold temperature section.

14. The under drive control circuit according to claim 8, wherein the control logic comprises:
an oscillator configured to generate a periodic signal; and
voltage control logic configured to select at least one value that matches the temperature information signal and the temperature characteristic signal among under drive time values and under drive offset values stored in a temperature characteristics mapping table, and to generate the voltage control signals according to the selected signal and the periodic signal.

15. A semiconductor apparatus comprising:
a memory cell array;
an address decoder connected to the memory cell array through a plurality of word lines, and configured to apply a plurality of voltages to a word line corresponding to a decoded row address among the plurality of word lines; and
an under drive control circuit configured to generate the plurality of voltages in response to voltage control signals, and generate the voltage control signals in order to adjust at least one of an under drive time and an under drive offset during an under drive operation of a semiconductor apparatus according to a temperature information signal and a pre-stored temperature characteristic signal of the semiconductor apparatus,
wherein the under drive operation is performed by applying a corresponding voltage of a read voltage and a verify voltage to a word line at an under drive level, which is lower than a target level, for a predetermined time in a section between pulses generated according to the corresponding voltage.

16. The semiconductor apparatus according to claim 15, further comprising:
a read and write circuit connected to the memory cell array through bit lines, and configured to perform a sensing operation for sensing program states of memory cells connected to the bit lines.

17. The semiconductor apparatus according to claim 15, wherein the under drive control circuit comprises:
- a temperature sensor configured to detect a temperature of the semiconductor apparatus and generate the temperature information signal.

18. The semiconductor apparatus according to claim 15, wherein the under drive time is a time when the corresponding voltage is applied at the under drive level, and the under drive offset is a difference between a target level of the corresponding voltage and the under drive level.

19. The semiconductor apparatus according to claim 15, wherein the under drive control circuit is configured to adjust the under drive offset by adjusting values of the voltage control signals, and to adjust the under drive time by adjusting generation timings of the voltage control signals.

20. The semiconductor apparatus according to claim 15, wherein the under drive control circuit is configured to
- divide a cold temperature section of a temperature section of the semiconductor apparatus into a first cold temperature section and a second cold temperature section lower than the first cold temperature section,
- to adjust one of the under drive time and the under drive offset when a temperature section determined according to the temperature information signal is the first cold temperature section, and
- to adjust the under drive time and the under drive offset when the temperature section determined according to the temperature information signal is the second cold temperature section.

* * * * *